United States Patent [19]
Hoshiba

[11] Patent Number: 5,506,748
[45] Date of Patent: Apr. 9, 1996

[54] CAPACITOR FOR SEMICONDUCTOR INTEGRATED CIRCUIT

[75] Inventor: Kazuhiro Hoshiba, Kyoto, Japan

[73] Assignee: Rohm Co., Ltd., Kyoto, Japan

[21] Appl. No.: 317,291

[22] Filed: Oct. 3, 1994

Related U.S. Application Data

[63] Continuation of Ser. No. 946,917, Sep. 18, 1992, abandoned.

[30]   Foreign Application Priority Data

Sep. 20, 1991 [JP] Japan ..................... 3-270019

[51] Int. Cl.$^6$ ............ H01G 4/06; H01L 27/108; H01L 29/94
[52] U.S. Cl. ............ 361/321.4; 257/296; 257/300; 257/303; 257/295
[58] Field of Search ............... 257/296, 300, 257/303, 304, 305, 306, 295, 68, 298, 71, 906; 29/25.42; 365/145, 149; 361/321.1, 321.2, 321.3, 321.4, 321.5, 313

[56]   References Cited

U.S. PATENT DOCUMENTS

| | | | |
|---|---|---|---|
| 3,599,185 | 8/1971 | Bartlett | 361/313 |
| 4,437,139 | 3/1984 | Howard | 361/313 |
| 4,827,323 | 5/1989 | Tigelaar et al. | 361/313 |
| 5,029,128 | 7/1991 | Toda | 365/145 |
| 5,043,049 | 8/1991 | Takenaka | 204/192.15 |
| 5,046,043 | 9/1991 | Miller et al. | 361/301 |
| 5,122,477 | 6/1992 | Wolters | 437/60 |
| 5,155,573 | 10/1992 | Abe et al. | 357/51 |
| 5,164,808 | 11/1992 | Evans, Jr. et al. | 361/305 |
| 5,293,510 | 3/1994 | Takenaka | 365/145 |

FOREIGN PATENT DOCUMENTS 2-304796 of 1990 Japan.

Primary Examiner—Bot L. Ledynh
Attorney, Agent, or Firm—Brumbaugh, Graves, Donohue & Raymond

[57] ABSTRACT

A first electrode, first ferroelectric thin-film, second electrode, second ferroelectric thin-film and third electrode are laid in this order on a source region of a field-effect transistor. The first and third electrodes are connected by a metal lead. The second electrode is connected to a ground line or a drive line.

5 Claims, 3 Drawing Sheets

CAPACITOR FOR SEMICONDUCTOR INTEGRATED CIRCUIT

This application is a continuation of application Ser. No. 07/946,917, filed on Sep. 18, 1992, now abandoned.

BACKGROUND OF THE INVENTION

The present invention relates to the structure of a capacitor used in a semiconductor integrated circuit. More specifically, the invention relates to a capacitor which employs a ferroelectric material, and a nonvolatile memory using this type of capacitor.

A memory cell disclosed in Japanese Patent Application Unexamined Publication No. Hei. 2-304796 is an example of this type of nonvolatile memory. FIGS. 6 and 7 show an equivalent circuit and a structure of this memory cell, respectively.

As shown in FIG. 6, the memory cell includes a field-effect transistor 10 as a switching device and a signal charge storing capacitor 20 using a ferroelectric material. The field-effect transistor 10 has a gate electrode 11, a drain electrode 12 and a source electrode 13, and the gate electrode 11 and the drain electrode 12 are connected to a word line L and a bit line BL, respectively. The capacitor 20 has a structure in which a ferroelectric thin-film 23 is sandwiched between two opposed electrodes 21 and 22. The electrodes 21 and 22 are respectively connected to the source electrode 13 of the field-effect transistor 10 and a ground line $V_{SS}$ or a drive line DL. The ferroelectric thin-film 23 is made of, for instance, lead zirconate titanate (PZT).

Referring to FIG. 7, the structure of the above memory cell is described in more detail. A field oxide film 2 is formed on a silicon substrate 1 by selectively oxidizing its surface layer to separate an area in which the devices are to be formed. A field-effect transistor 10 consisting of a gate electrode 11 covered with an oxide film 3, a drain region 12a and a source region 13a is formed in this separated area. A first electrode 21, a ferroelectric thin-film 23 and a second electrode 22 are sequentially laid in this order on the source region 13a, to form a capacitor 20. Then, a metal lead 4 for the bit line BL is formed on the drain region 12a, and another metal lead 5 for the ground line $V_{SS}$ or drive line DL is formed on the second electrode 22.

However, the conventional memory cell having the above structure is associated with the following problem. Since ferroelectric materials such as PZT have a large dielectric constant, they are suitable for the charge storing material in the above memory cell. Due to the requirement of high-density integration, the cell area of the above type of memory cell and, therefore, the area of the capacitor should be designed to be as small as possible. However, there is some limit in reducing the capacitor area, because the decreased signal charge quantity stored in the capacitor, as is caused by the excessive reduction of the capacitor area, will result in a difficulty in the signal reading.

SUMMARY OF THE INVENTION

The present invention has been made in view of the above circumstances in the art, and has an object of providing a capacitor for a semiconductor integrated circuit and a nonvolatile memory using that capacitor, the capacitor having a small occupation area but still being capable of storing signal charge of enough quantity.

According to the invention, a capacitor for a semiconductor integrated circuit comprises: a first electrode, a first ferroelectric film, a second electrode, a second ferroelectric film and a third electrode which are laid in this order on a semiconductor substrate; and a conductive lead for connecting the first and third electrodes; wherein the second electrode and the conductive lead serve as terminals of the capacitor.

The capacitor having the above construction may be used as a signal charge storing capacitor of a nonvolatile memory.

DESCRIPTION OF THE PREFERRED EMBODIMENT

Before explaining the operation of a capacitor of the present invention, for comparison, the charge storing operation of a conventional capacitor using a ferroelectric material is described with reference to FIGS. 4 and 5.

Figure 4:
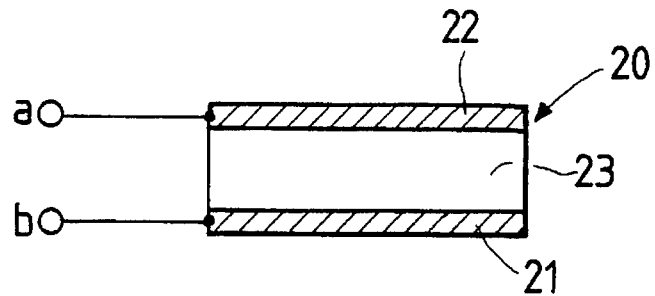
FIG. 4 is a schematic diagram showing a conventional capacitor as picked up from a semiconductor substrate.
Figure 5:
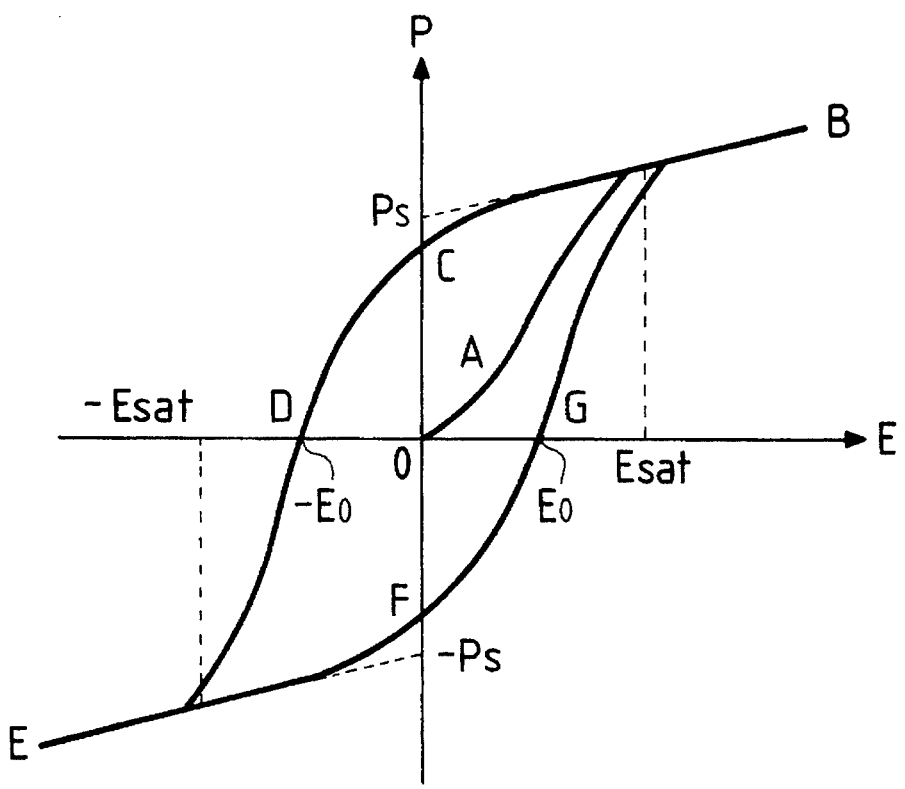
FIG. 5 is a characteristic diagram showing a relationship between an electric field strength between electrodes of the capacitor of FIG. 4 including a ferroelectric thin-film and a polarization in the ferroelectric thin-film.
Figure 6:
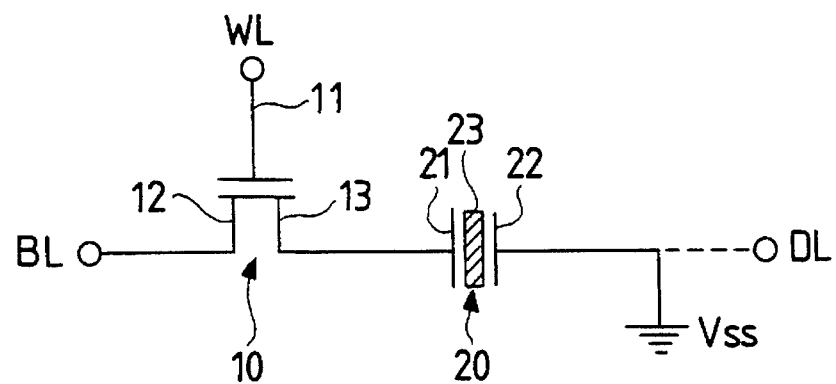
FIG. 6 is an equivalent circuit diagram of a conventional nonvolatile memory.
Figure 7:
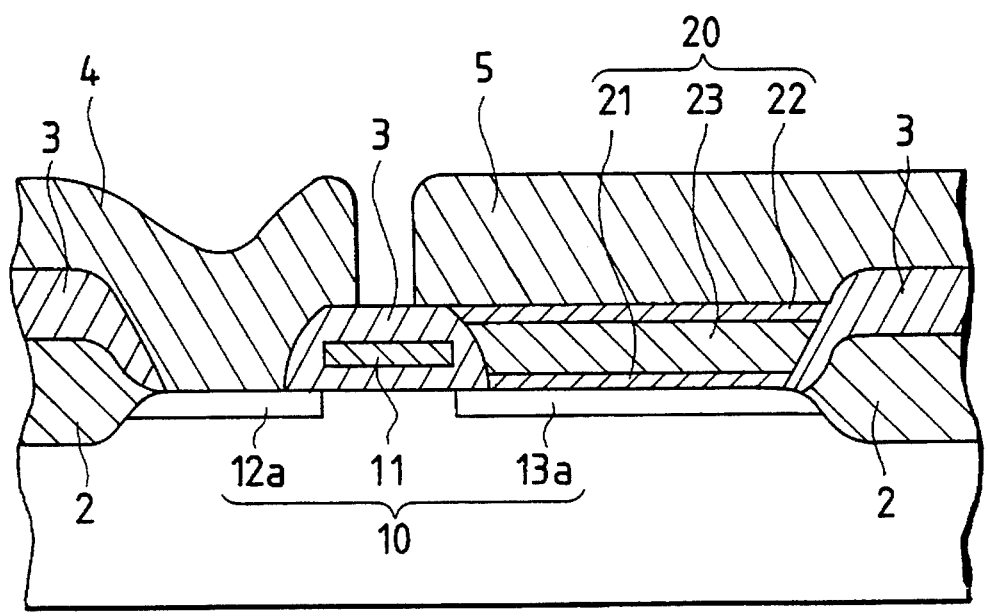
FIG. 7 is a sectional view showing a structure of the nonvolatile memory of FIG. 6.

FIG. 4 is a schematic diagram of a conventional capacitor 20 as picked up from a semiconductor substrate. Reference characters a and b in FIG. 4 represent terminals of the capacitor 20. FIG. 5 shows how the quantity of charge stored in a ferroelectric thin-film 23 sandwiched between electrodes 21 and 22 is varied as a voltage applied across the terminals a and b is changed. In FIG. 5, the abscissa and ordinate represent an electric field strength E and a polarization P, respectively. With the variation of the voltage across the terminals a and b, the polarization P in the ferroelectric thin-film 23 is changed to go along a route of O →A →B →C →D →E →F →G →B (hysteresis characteristic).

When the electric field strength E between the electrodes 21 and 22 is increased past $E_0$ to a sufficiently large value $E_{sat}$ and then returned to zero, a polarization (i.e., spontaneous polarization) $P_S$ remains in the ferroelectric thin-film 23. Similarly, when the electric field strength E is decreased to —$E_{sat}$ and then returned to zero, a polarization —$P_S$ remains in the ferroelectric thin-film 23. By establishing a correspondence between the positive and negative spontaneous polarizations ±$P_S$ and written states of data "1" and "0", reading signal charge Q can be obtained from the capacitor 20 such that:

$$Q=2P_S \cdot S \quad (C) \tag{1}$$

where S represents an area of the capacitor 20. The spontaneous polarization $P_S$ depends on the composition, thickness, etc. of the ferroelectric thin-film 23.

Figure 1:
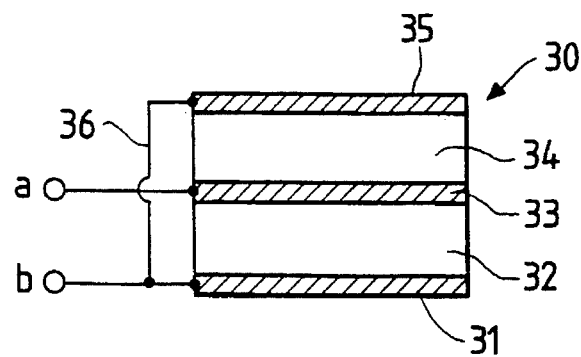
FIG. 1 is a schematic diagram showing a capacitor of the present invention as picked up from a semiconductor substrate.

Now, referring to FIG. 1, the charge storing operation of a capacitor according to the invention is described below. FIG. 1 is a schematic diagram of a capacitor 30 of the invention as picked up from a semiconductor substrate. In the capacitor 30, a first electrode 31, a first ferroelectric thin-film 32, a second electrode 33, a second ferroelectric thin-film 34 and a third electrode 35 are laid in this order on a semiconductor substrate (not shown). The second electrode 33 serves as one terminal a of the laminated capacitor 30 and a metal lead 36 connecting the first and third electrodes serves as the other terminal b.

As is apparent from FIG. 1, the capacitor 30 of the laminated structure is a parallel connection of a first capacitor consisting of the first electrode 31, first ferroelectric thin-film 32 and second electrode 33, and a second capacitor consisting of the second electrode 33, second ferroelectric thin-film 34 and third electrode 35. Therefore, the capacitor 30 stores reading signal charge Q':

$$Q'=2P_{S1} \cdot S + 2P_{S2} \cdot S \quad (2)$$

where $P_{S1}$ and $P_{S2}$ are spontaneous polarizations of the first and second ferroelectric thin-films 32 and 34, respectively. If it is assumed that $P_{S1} \cong P_{S2} \cong P_S$, $$Q' \cong 2Q \ (C). \quad (3)$$

It is understood that according to the capacitor 30 of the invention, the quantity of stored signal charge can be made two times larger than the conventional capacitor 20 while the capacitor area is kept the same. In other words, the capacitor of the invention having an area that is a half the area of the conventional capacitor can store the same quantity of signal charge.

Figure 2:
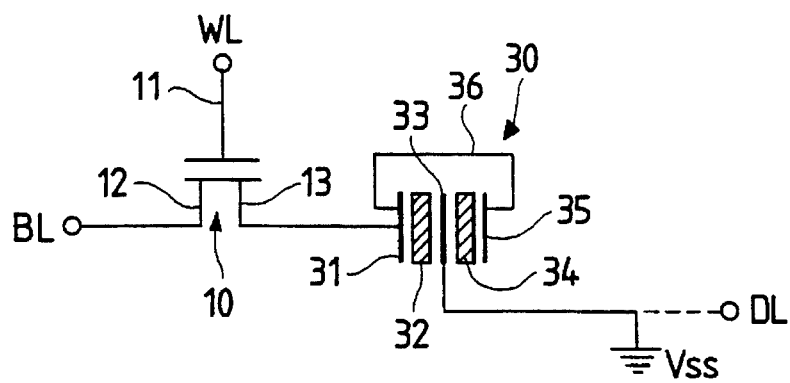
FIG. 2 is an equivalent circuit diagram of a nonvolatile memory which employs the capacitor of the invention.
Figure 3:
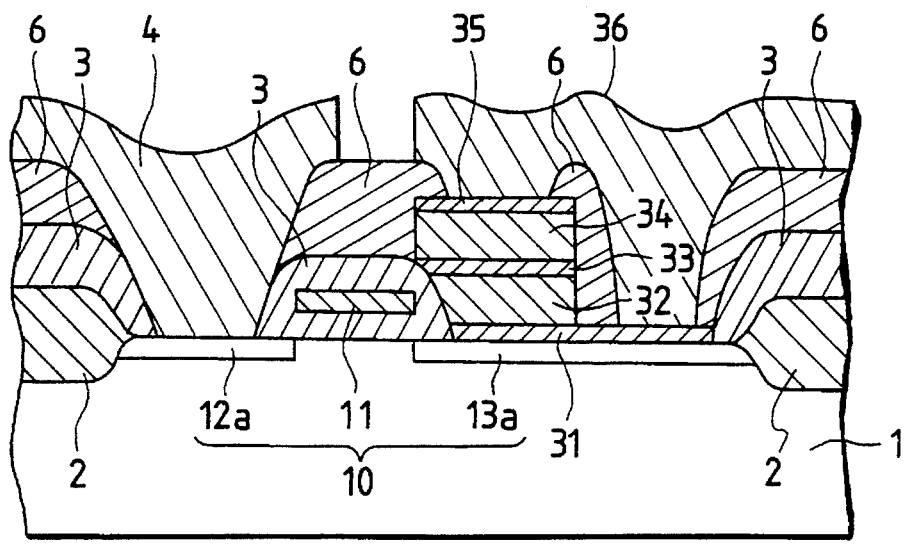
FIG. 3 is a sectional view showing a structure of the nonvolatile memory of FIG. 2.

An embodiment of the invention is described below with reference to FIGS. 2 and 3. FIG. 2 is an equivalent circuit diagram of a nonvolatile memory using the capacitor 30 according to the invention. FIG. 3 is a sectional view showing its structure.

As shown in FIG. 2, the first electrode 31 of the capacitor 30 is connected to the third electrode 35 via the metal lead 36, and also to the source electrode 13 of the field-effect transistor 10. The second electrode 33 is connected to the ground line $V_{SS}$ or the drive line DL. That is, the first capacitor consisting of the first electrode 31, first ferroelectric thin-film 32 and second electrode 33, and the second capacitor consisting of the second electrode 33, second ferroelectric thin-film 34 and third electrode 35 are connected in parallel to provide a signal charge storing capacitor for the field-effect transistor 10. Although in this embodiment an n-type MOS transistor is employed as a switching device, other types of devices, such as a p-type MOS transistor, a JFET using a GaAs semiconductor and a bipolar transistor, may be used.

Referring to FIG. 3, the structure of the nonvolatile memory of FIG. 2 is described in detail.

First, a device forming area is separated by forming a field oxide film 2 on a p-type silicon substrate 1. Then, a gate electrode 11, an n+ drain region 12a and an n+ source region 13a are formed. This type of field-effect transistor 10 can be produced using the well-known self-alignment technique. Further, the field-effect transistor 10 may employ the LDD (lightly doped drain) structure to avoid hot electron problems that are associated with the device miniaturization. While the gate electrode 11 is typically made of phosphorus-doped polysilicon, it may be made of metal or silicide, i.e., a compound of polysilicon and a metal having a high melting temperature such as tungsten or molybdenum.

The silicon substrate 1, on which the field-effect transistor 10 has been formed, is then covered with an insulating film such as a thermally oxidized silicon film 3. Then, a portion of the oxide film 3 in which the first electrode 31 of the capacitor 30 is to be formed is removed by anisotropic etching such as plasma etching. The first electrode 31 is formed on the source region 13a by depositing a metal film of platinum etc. by, e.g., sputtering and then patterning it by photoetching.

After formation of the first electrode 31, the first ferroelectric thin-film 32 is formed by covering the first electrode 31 with a ferroelectric material by the sol-gel method by spin coating, MOD (metal organic decomposition) method, sputtering method, MOCVD (metal organic chemical vapor deposition) method or laser application method, and then patterning it by photoetching. Preferred examples of the ferroelectric material used in the above process are lead zirconate titanate (PZT) and $(Pb_xLa_{1-x})(Zr_yTi_{1-y})O_3$ (PLZT). Then, the second electrode 33 is formed on the first ferroelectric thin-film 32 in the same manner as the first electrode 31, and the second ferroelectric thin-film 34 is formed on the second electrode 33 in the same manner as the first ferroelectric thin-film 32. Further, the third electrode 35 is formed on the second ferroelectric thin-film 34.

After formation of the ferroelectric-laminated capacitor 30, an insulating film 6 is deposited. Typical examples of the insulating film 6 are borophosphosilicate glass (BPSG) that is produced by mixing boron atoms into phosphosilicate glass (PSG) by the CVD method and a triethylorthosilicate (TEOS) film that is a silicon oxide film produced by having a silicon ethylic compound react with ozone ($O_3$). The insulating film 6 is then partially removed to provide contacts between the drain region 12a and the metal lead (bit line) 4, between the first electrode 31 and the metal lead 36, and between the third electrode 35 and the metal lead 36.

A metal thin-film for the metal leads 4 and 36 is deposited, for instance, by sputtering. Although metals such as aluminum alloys (e.g., Al-Si and Al-Si-Cu) are usually employed as this type of conductive material, conductive nonmetallic materials such as phosphorus-doped polysilicon may also be used. The contact between the third electrode 35 and the metal lead 36 may be taken by burying a conductive material such as polysilicon or tungsten between the third electrode 35 and the metal lead 36 by the etching back method, selective CVD method, etc.

Then, the metal thin-film is patterned by photoetching to provide the metal leads 4 and 36. The first electrode 31 and the third electrode 35 of the capacitor 30 are connected to each other by the metal lead 36. The first electrode 31 and the third electrode 35 are connected to the source region 13a of the field-effect transistor 10. Further, although not shown in FIG. 3, the second metal lead 33 of the capacitor 30 is connected to the ground line $V_{SS}$ or drive line DL. Thus, the nonvolatile memory having the structure of FIG. 3 is produced.

Although the above embodiment is described of the case in which the ferroelectric-laminated capacitor according to the invention is employed as the signal charge storing capacitor of the nonvolatile memory, the invention is not limited to such a case, but the capacitor of the invention can also be used as a general capacitor in an integrated circuit.

As is apparent from the foregoing description, according to the invention, since two capacitors including a ferroelectric material are laminated and connected in parallel, the capacitor of the invention can store a larger amount of charge without increasing its occupation area on a substrate. In other words, the capacitor of the invention having an occupation area that is only a half of that of the conventional capacitor can store the same amount of charge, which will contribute to increasing the density of integrated circuits. When the capacitor of the invention is employed as the signal charge storing capacitor of the nonvolatile memory, the reduction of the memory cell area will greatly contribute to increasing the integration density of a semiconductor memory device having a large number of memory cells.

What is claimed is:

1. A semiconductor integrated circuit nonvolatile memory unit, comprising:

a semiconductor substrate;

a switching transistor formed on the semiconductor substrate including spaced source and drain regions and a gate electrode spaced therefrom by an insulating layer;

a capacitor comprising a first electrode, a first ferroelectric film, a second electrode, a second ferroelectric film and a third electrode which are laid in this order on one of the source and drain regions of the semiconductor substrate;

the switching transistor and the capacitor electrodes and ferroelectric films being confined between spaced field oxide regions;

an insulating layer extending over the switching transistor and the capacitor;

a first conductive lead extending through the insulating layer to connect the first and third electrodes and providing one terminal of the capacitor, the first electrode being connected to said one of the source and drain regions on which the capacitor is formed;

a second conductive lead connected to the second electrode and providing another terminal of the capacitor; and a third conductive lead extending through the insulating layer and connected to the other of the source and drain regions.

2. The nonvolatile memory unit of claim 1, wherein the first and second ferroelectric films are made of lead zirconate titanate.

3. The nonvolatile memory unit of claim 1, wherein the first and second ferroelectric films are made of PLZT.

4. The nonvolatile memory unit of claim 1, wherein the switching transistor is a field-effect transistor, and the first electrode is formed on the source region of the field-effect transistor.

5. The nonvolatile memory unit of claim 4, wherein the second electrode is connected to a ground line or a drive line.

* * * * *